(12) United States Patent
Wu et al.

(10) Patent No.: US 11,226,511 B2
(45) Date of Patent: Jan. 18, 2022

(54) DISPLAY PANEL AND DISPLAY DEVICE

(71) Applicant: Xiamen Tianma Micro-Electronics Co., Ltd., Xiamen (CN)

(72) Inventors: Ling Wu, Xiamen (CN); Binyi Zheng, Xiamen (CN); Boping Shen, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 124 days.

(21) Appl. No.: 16/670,155

(22) Filed: Oct. 31, 2019

(65) Prior Publication Data
US 2020/0348550 A1    Nov. 5, 2020

(30) Foreign Application Priority Data
Apr. 30, 2019   (CN) .......................... 201910359713.X

(51) Int. Cl.
| G02F 1/1333 | (2006.01) |
| G02F 1/1335 | (2006.01) |
| G02F 1/1362 | (2006.01) |
| G06K 9/00 | (2006.01) |

(Continued)

(52) U.S. Cl.
CPC .... *G02F 1/13338* (2013.01); *G02F 1/133512* (2013.01); *G02F 1/136209* (2013.01); *G06K 9/0004* (2013.01); *G02F 1/134363* (2013.01); *H01L 27/14623* (2013.01)

(58) Field of Classification Search
None
See application file for complete search history.

(56) References Cited

U.S. PATENT DOCUMENTS

| 2006/0103799 A1* | 5/2006 | Ikeda ..................... G02F 1/1393 349/124 |
| 2010/0165267 A1* | 7/2010 | Yoshida .............. G02F 1/13318 349/106 |
| 2017/0017824 A1* | 1/2017 | Smith .................... G02B 6/005 |

(Continued)

FOREIGN PATENT DOCUMENTS

| CN | 207037681 U | 2/2018 |
| CN | 107844767 A | 3/2018 |

(Continued)

*Primary Examiner* — Shan Liu
(74) *Attorney, Agent, or Firm* — Anova Law Group, PLLC

(57) ABSTRACT

Display panel and display device are provided. The display panel includes: a color film substrate, an array substrate, at least one light sensitive unit, and collimating apertures penetrating a portion of film layers of the color film substrate and the array substrate along a first direction perpendicular to the display panel. The collimating apertures and the at least one light sensitive unit are disposed in a one-to-one correspondence. The color film substrate includes a first substrate, a first light-blocking layer with first openings, and at least one second light-blocking layer with second openings. The array substrate includes a third light-blocking layer with third openings. An orthographic projection of each first opening, an orthographic projection of a corresponding second opening, and an orthographic projection of a corresponding third opening, at least partially overlap an orthographic projection of a corresponding collimating aperture on the first substrate.

19 Claims, 11 Drawing Sheets

(51) Int. Cl.
 G02F 1/1343 (2006.01)
 H01L 27/146 (2006.01)

(56) References Cited

U.S. PATENT DOCUMENTS

| | | | |
|---|---|---|---|
| 2018/0211085 A1* | 7/2018 | Liu | H01L 27/14678 |
| 2018/0247100 A1* | 8/2018 | Zhu | G06K 9/0004 |
| 2018/0270403 A1* | 9/2018 | Chung | H04N 5/2256 |
| 2019/0026530 A1* | 1/2019 | Wu | H01L 27/146 |
| 2019/0056613 A1* | 2/2019 | Wang | G02F 1/13338 |
| 2019/0114457 A1* | 4/2019 | Li | G02F 1/1343 |
| 2019/0172886 A1* | 6/2019 | Ma | G06K 9/0004 |
| 2019/0243154 A1* | 8/2019 | Hai | G02B 27/30 |
| 2019/0296055 A1* | 9/2019 | Lius | H01L 27/124 |
| 2020/0219948 A1* | 7/2020 | Kim | G09G 3/3266 |
| 2020/0293738 A1* | 9/2020 | Zhang | G02F 1/133606 |
| 2021/0110131 A1* | 4/2021 | Lin | H01L 27/14621 |

FOREIGN PATENT DOCUMENTS

| | | |
|---|---|---|
| CN | 108734073 A | 11/2018 |
| CN | 109445176 A | 3/2019 |
| CN | 109541857 A | 3/2019 |

\* cited by examiner

DISPLAY PANEL AND DISPLAY DEVICE

CROSS-REFERENCES TO RELATED APPLICATION

This application claims the priority of Chinese Patent Application No. 201910359713.X, filed on Apr. 30, 2019, the content of which is incorporated herein by reference in its entirety.

TECHNICAL FIELD

The present disclosure generally relates to the field of display technology and, more particularly, relates to a display panel and a display device.

BACKGROUND

As mobile display products are used popularly, information security has attracted people's attention. Fingerprints are invariant features that are inherently unique and distinguishable from others. The fingerprints include a series of ridges and valleys on surfaces of fingertips. Details of the ridges and valleys usually include branches of the ridges, ends of the ridges, arches, tent arches, left chiralities, right chiralities, spirals, and/or double spirals of the ridges. These details endow the uniqueness of the fingerprint patterns. Since the fingerprints are unique, difficult to reproduce, and safe, fingerprint identification technology has been widely used in the mobile display products recently, as a way of identification authentications and access controls. Security and ease of operation of the mobile display products have been improved.

In a light fingerprint identification using the principle of light refraction and reflection, a finger is placed on a light lens, and sensors receive different fingerprint information since a light is reflected differently at the ridges and the valleys of the fingerprint. Correspondingly, a fingerprint pattern is formed. This method is relatively simple and suitable for achieving a full-screen design of mobile display products. However, the sensors used in the light fingerprint identification are easily interfered by light noises, and an accuracy of the fingerprint identification is difficult to be improved.

How to improve the accuracy of the fingerprint identification is a technical problem to be solved imperatively in the field for realizing a full-screen design of the mobile display products.

SUMMARY

One aspect of the present disclosure provides an irregular-shaped display panel. The display panel includes: a color film substrate; an array substrate; at least one light sensitive unit at a side of the array substrate adjacent to the color film substrate; and collimating apertures penetrating a portion of film layers of the color film substrate and the array substrate along a first direction perpendicular to the display panel. The collimating apertures and the at least one light sensitive unit are disposed in a one-to-one correspondence. The color film substrate includes a first substrate, a first light-blocking layer, and at least one second light-blocking layer. The first light-blocking layer is disposed at a side of the first substrate adjacent to the array substrate, and includes a plurality of first openings. The at least one second light-blocking layer is disposed at a side of the first light-blocking layer adjacent to the array substrate, and includes a plurality of second openings. The array substrate includes a third light-blocking layer. The third light-blocking layer is disposed at a side of the array substrate adjacent to the color film substrate, and includes a plurality of third openings. An orthographic projection of each of the plurality of first openings on the first substrate, an orthographic projection of a corresponding second opening of the plurality of second openings on the first substrate, and an orthographic projection of a corresponding third opening of the plurality of third openings on the first substrate, at least partially overlap an orthographic projection of a corresponding collimating aperture of the collimating apertures on the first substrate.

Another aspect of the present disclosure provides a display device. The display device includes a display panel including a color film substrate, an array substrate, at least one light sensitive unit at a side of the array substrate adjacent to the color film substrate, and collimating apertures penetrating a portion of film layers of the color film substrate and the array substrate along a first direction perpendicular to the display panel. The collimating apertures and the at least one light sensitive unit are disposed in a one-to-one correspondence. The color film substrate includes a first substrate, a first light-blocking layer, and at least one second light-blocking layer. The first light-blocking layer is disposed at a side of the first substrate adjacent to the array substrate and includes a plurality of first openings. The at least one second light-blocking layer is disposed at a side of the first light-blocking layer adjacent to the array substrate and includes a plurality of second openings. The array substrate includes a third light-blocking layer. The third light-blocking layer is disposed at a side of the array substrate adjacent to the color film substrate and includes a plurality of third openings. An orthographic projection of each of the plurality of first openings on the first substrate, an orthographic projection of a corresponding second opening of the plurality of second openings on the first substrate, and an orthographic projection of a corresponding third opening of the plurality of third openings on the first substrate, at least partially overlap an orthographic projection of a corresponding collimating aperture of the collimating apertures on the first substrate.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
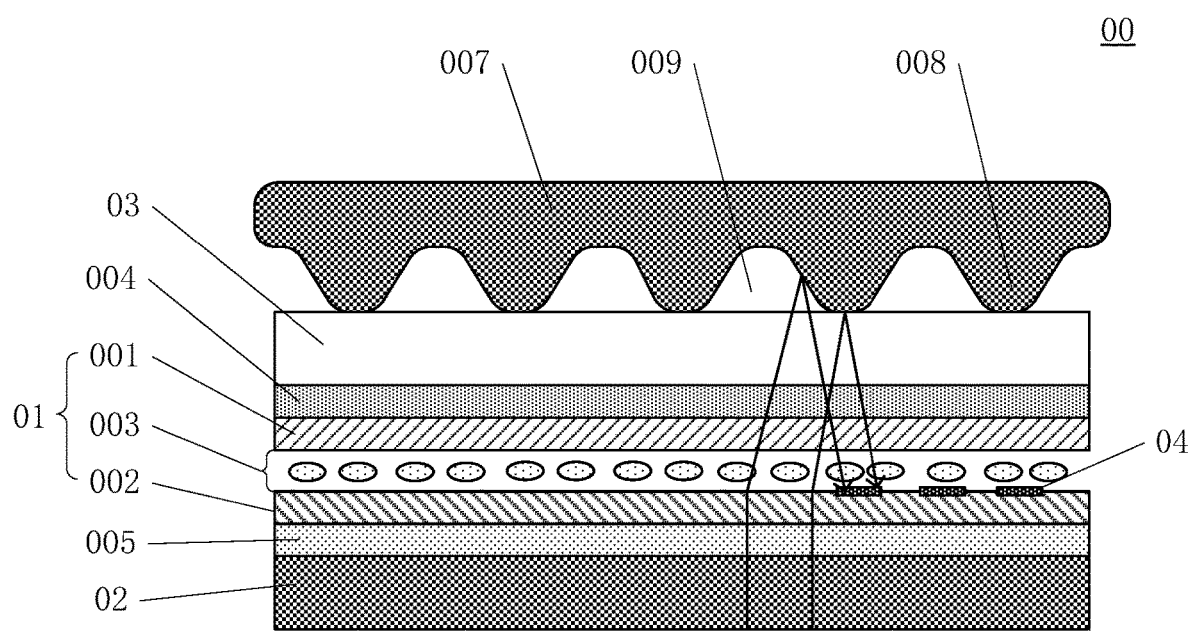
FIG. 1 illustrates a display module.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

In a display panel with a fingerprint identification function, a fingerprint identification operation is inaccurate usually.

As illustrated in FIG. 1 showing a display module 00 in the current technology, the display module 00 may include a display panel 01, a backlight module 02 opposite to the display panel, and a glass cover 03 on a light exiting surface of the display panel 01. The display panel 01 may include a color film substrate 001, an array substrate 002 opposite to the color film substrate 001, and a liquid crystal layer 003 between the color film substrate 001 and the array substrate 002. The liquid crystal layer 003 may include liquid crystal molecules. A fingerprint identification module 04 may be disposed on the array substrate 002. The display panel 01 may further include an upper polarizer 004 on the color film substrate 001 away from the backlight module 02 and a lower polarizer 005 on the array substrate 002 adjacent to the backlight module 02. A working principle of the fingerprint identification module 04 may include: lights from a light source may be reflected when arriving at ridges and valleys of a fingerprint when a finger contacts the display panel; the lights reflected by the ridges and the valleys may be projected to the fingerprint identification module 04 since reflecting angles and intensity of the reflected lights of the ridges and the valleys may be different; the fingerprint identification module 04 may transmit received sensing signals to a fingerprint identification signal receiving module (not shown in the figures) through fingerprint signal wires; and the fingerprint identification signal receiving module may identify the ridges and the valleys of the fingerprint according to the received signals. When the finger 007 contacts the glass cover 03, a series of ridges 008 and valleys 009 on a skin surface of the fingertip may form a fingerprint. The light from the light source may arrive at the finger 03 through the liquid crystal layer 003, the color film substrate 001, the upper polarizer 004, and the glass cover 03. It may be reflected and arrive at the fingerprint identification module 04 on the array substrate 02 through the glass cover 03, the upper polarizer 004, the color film substrate 001, and the liquid crystal layer 003 sequentially.

Since a few fingerprint information reflected to the fingerprint identification module 04 is large and covers information of more than one pair of the ridge and valley, the fingerprint is difficult to image. Especially, crosstalk lights of adjacent fingerprint identification regions may be reflected to the fingerprint identification module 04 to form light noise information and the fingerprint image may be interfered.

The present disclosure provides a display panel and a display device to at least partially resolve above problems.

Figure 2:
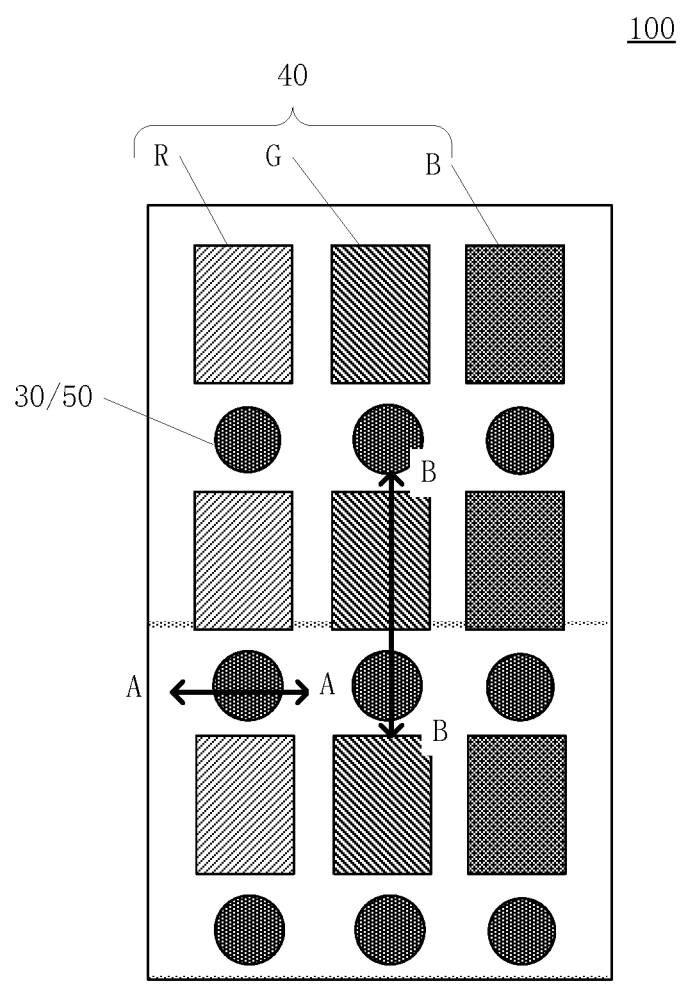
FIG. 2 illustrates an exemplary display panel consistent with various disclosed embodiments of the present disclosure.
Figure 3:
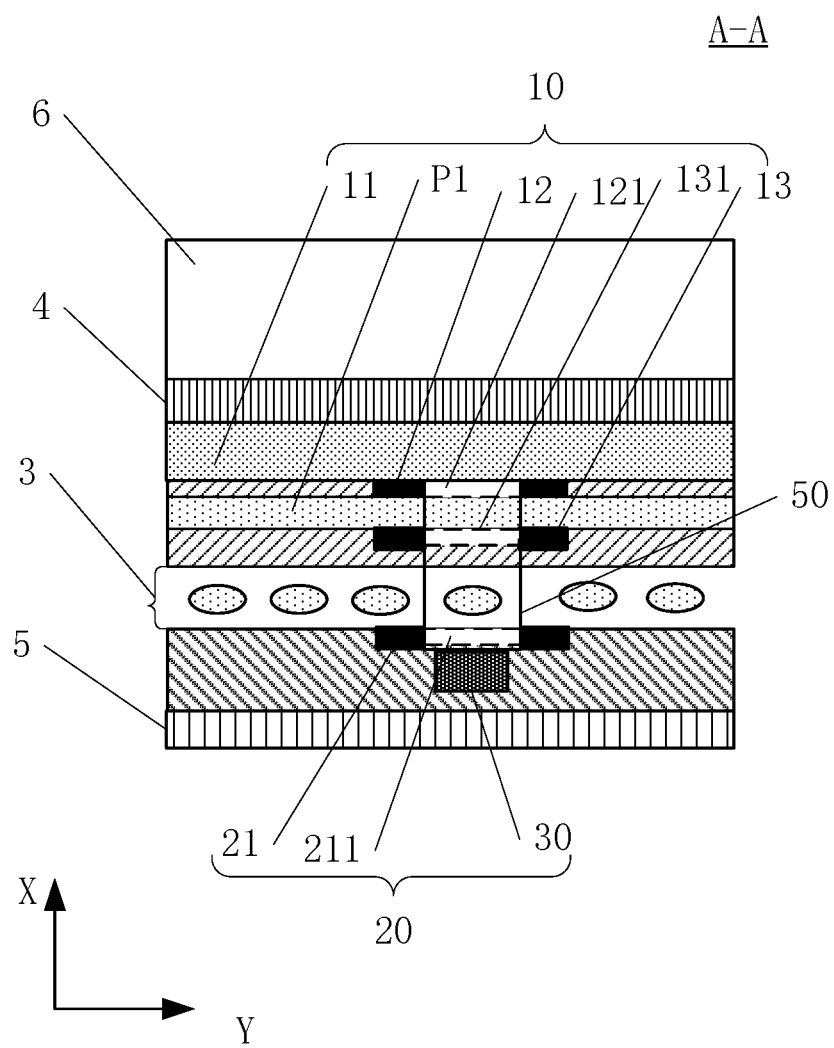
FIG. 3 illustrates a cross-sectional view of the display panel along an A-A direction in FIG. 2 consistent with various disclosed embodiments of the present disclosure.

FIG. 2 illustrates a display panel provided by an embodiment in the present disclosure; and FIG. 3 illustrates a cross-sectional view of the display panel along an A-A direction in FIG. 2. In one embodiment, as illustrated in FIG. 3, the display panel 100 may include a color film substrate 10, an array substrate 20 opposite to the color film substrate 10, and at least one light sensitive unit 30 on a side of the array substrate 20 adjacent to the color film substrate 10. As illustrated in FIG. 2, the display panel 100 may further include collimating apertures 50, and the collimating apertures 50 may penetrate through a portion of film layers of the color film substrate 10 and the array substrate 20 along a first direction X. The collimating apertures 50 and the at least one light sensitive unit 30 may be disposed in a one-to-one correspondence. The first direction X may be perpendicular to the display panel. The color film substrate 10 may include a first substrate 11, a first light-blocking layer 12, and at least one second light-blocking layer 13. The first light-blocking layer 12 may be disposed at a side of the first substrate 11 adjacent to the array substrate 20 and may include a plurality of first openings 121. The at least one second light-blocking layer 13 may be disposed at a side of the first light-blocking layer 12 adjacent to the array substrate 20 and may include a plurality of second openings 131. The array substrate 20 may include a third light-blocking layer 21 at a side of the array substrate 20 adjacent to the color film substrate 10. The third light-blocking layer 21 may include a plurality of third openings 211. An orthographic projection of each of the plurality of first openings 121, an orthographic projection of a corresponding second opening 131 of the plurality of second openings 131, and an orthographic projection of a corresponding third opening 211 of the plurality of third openings 211, on the first substrate 11 may at least partially overlap an orthographic projection of a corresponding collimating aperture 50 of the plurality of collimating apertures 50 on the first substrate 11. For description purposes only, the embodiment in FIG. 3 where the orthographic projection of each of the plurality of first openings 121, the orthographic projection of the corresponding second opening 131, and the orthographic projection of the corresponding third opening 211, on the first substrate 11 completely overlap the orthographic projection of the corresponding collimating aperture 50 on the first substrate 11, is used as an example to illustrate the present disclosure and should not limit scopes of the present disclosure. In some other embodiments, the orthographic projection of each of the plurality of first openings 121, the orthographic projection of the corresponding second opening 131, and the orthographic projection of the corresponding third opening 211, on the first substrate 11 may only partially overlap the orthographic projection of the corresponding collimating aperture 50 on the first substrate 11.

As illustrated in FIG. 2, the display panel 100 may further include pixels 40, and the pixels 40 may include sub-pixels. The sub-pixels may at least include sub-pixels for R, G, and B color. As illustrated in FIG. 3, a liquid crystal layer 3 may be disposed between the color film substrate 10 and the array substrate 20. The display panel 100 may further include an upper polarizer 4 at a side of the color film substrate 10 away from the array substrate 20, a lower polarizer 5 at a side of the array substrate 20 away from the color film substrate 10, a glass cover 6 on a light exiting surface of the display panel 100, and a first planarizing layer P1 between the first light-blocking layer 12 and the at least one second light-blocking layer 13. A size of the array substrate 20 may be larger than a size of the color film substrate 10, to form a step area between the array substrate 20 and the color film substrate 10. The step area may be used to bound devices including integrated circuits providing driving signals to the array substrate 10.

The first light-blocking layer 12, the at least one second light-blocking layer 13, and the third light-blocking layer 21 may be made of a material with a very low light transmittance. The collimating apertures 50 penetrating through a portion of film layers of the color film substrate 10 and the array substrate 20 along the first direction X may be optical channels formed by lights reflected by the ridges and valleys of the fingerprint and passing through the portion of the film layers of the color film substrate 10 and the array substrate 20. The orthographic projection of each of the plurality of first openings 121, the orthographic projection of the corresponding second opening 131, and the orthographic projection of the corresponding third opening 211, on the first substrate 11 may at least partially overlap the orthographic projection of the corresponding collimating aperture 50 on the first substrate 11, along the first direction X. Correspondingly, each of the plurality of first openings 121, the corresponding second opening 131, and the corresponding third opening 211, may form a corresponding channel collimating aperture 50 to control a transmission of the light. For each of the plurality of collimating apertures 50, the light reflected by the ridges and the valleys of the fingerprint may arrive at a corresponding light sensitive unit 30 of the at least one light sensitive unit 30 through a corresponding first opening 121 of the plurality of first openings 121, a corresponding second opening 131 of the plurality of second openings 131, and a corresponding third opening 211 of the plurality of third openings 211 (the one of the plurality of collimating apertures 50). Since a portion of the first light-blocking layer 12 except the plurality of first openings 121 may block the light transmission, the light arriving at each of the at least one light sensitive unit 30 may be only from one ridges or one valley of the fingerprint. An interference may be avoided, and an accuracy of the fingerprint identification may be improved.

As illustrated in FIG. 3, the first planarizing layer P1 may be disposed between the first light-blocking layer 12 and the at least one second light-blocking layer 13. The first planarizing layer P1 may be made of a material with a high light transmittance and may not affect a transmission of the light. For description purposes only, the embodiment in FIG. 3 where a shape of the plurality of first openings 121, a shape of the plurality of second openings 131, and a shape of the plurality of third openings 211 is a circle is used as an example to illustrate the present disclosure, and should not limit the scopes of the present disclosure. In various embodiments, the plurality of first openings 121, the plurality of second openings 131, and the plurality of third openings 211 may have any other suitable shape.

In the present disclosure, the display panel may include the color film substrate and the array substrate opposite to the color film substrate. The at least one light sensitive unit may be disposed at the side of the array substrate adjacent to the color film substrate. The display panel may further include the plurality of collimating apertures penetrating through the portion of the film layers of the color film substrate and the array substrate along the first direction. The plurality of collimating apertures and the at least one light sensitive unit may be disposed in a one-to-one correspondence. The first direction may be perpendicular to the display panel. The color film substrate may include the first substrate, the first light-blocking layer, and the at least one second light-blocking layer. The first light-blocking layer may be disposed at the side of the first substrate adjacent to the array substrate and may include the plurality of first openings. The at least one second light-blocking layer may be disposed at the side of the first light-blocking layer adjacent to the array substrate and may include the plurality of second openings. The array substrate may include the third light-blocking layer. The third light-blocking layer may be disposed at the side of the array substrate adjacent to the color film substrate and may include the plurality of third openings. The orthographic projection of each of the plurality of first openings, the orthographic projection of the corresponding second opening, and the orthographic projection of the corresponding third opening, on the first substrate may at least partially overlap the orthographic projection of the corresponding collimating aperture on the first substrate, along the first direction, to provide a channel to the fingerprint information received by the at least one light sensitive unit. The light entering the collimating apertures may be also constrained. An influence of the light noise on the fingerprint information may be avoided, and the accuracy of the fingerprint identification may be improved.

In one embodiment, the array substrate may further include a second substrate, a buffer layer, light sensitive units, a common electrode layer, a first insulating layer, and a pixel electrode layer. The buffer layer, the light sensitive units, the common electrode layer, the first insulating layer, and the pixel electrode layer may be stacked on the second substrate sequentially. The pixel electrode layer may include at least one fourth openings, or the first insulating layer may include at least one fifth opening. An orthographic projection of each of the at least one fourth opening on the first substrate may at least partially overlap an orthographic projection of a corresponding light sensitive unit of the light sensitive units, or an orthographic projection of each of the at least one fifth opening on the first substrate may at least partially overlap an orthographic projection of a corresponding light sensitive unit of the light sensitive units.

Figure 4:
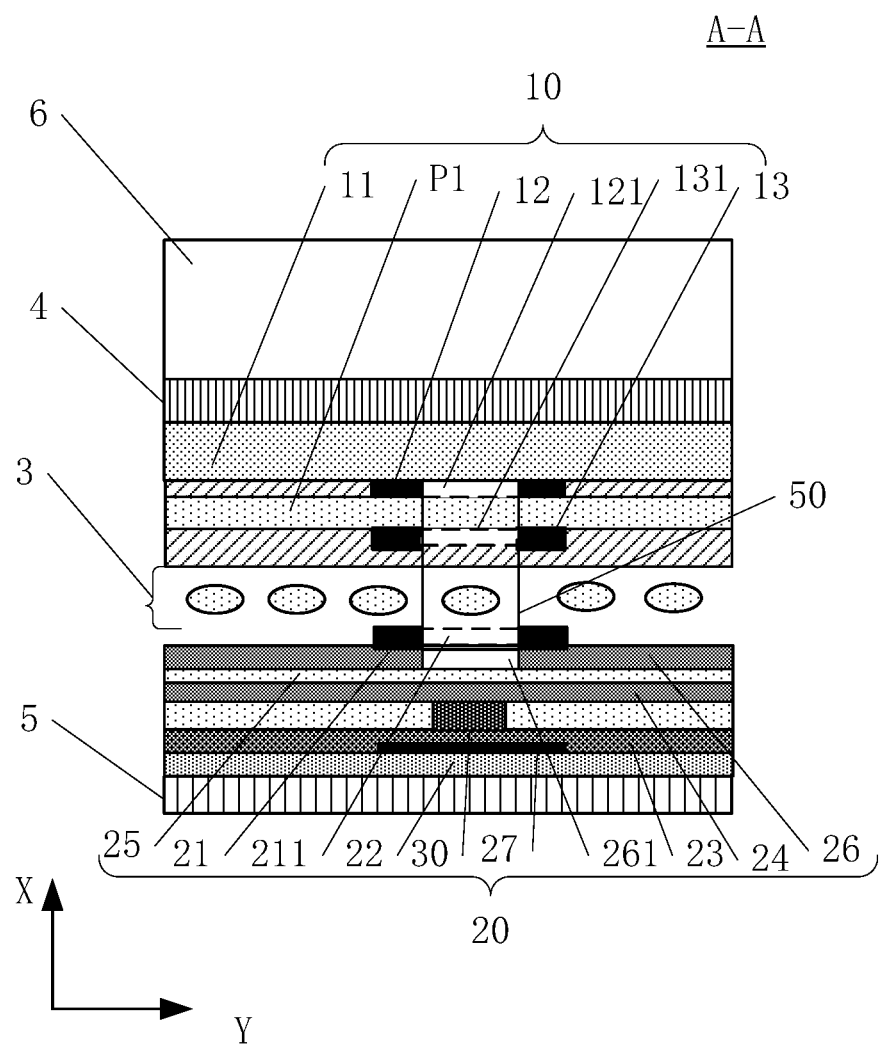
FIG. 4 illustrates another cross-sectional view of the display panel along the A-A direction in FIG. 2 consistent with various disclosed embodiments of the present disclosure.
Figure 5:
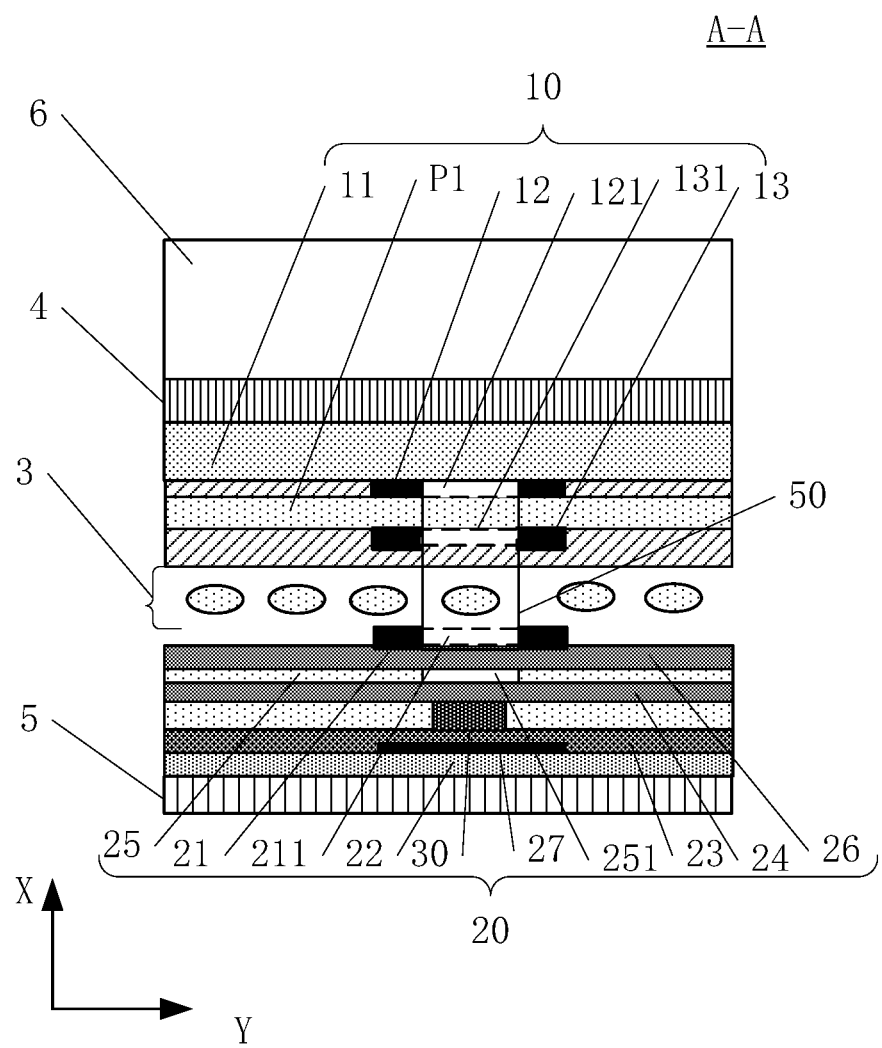
FIG. 5 illustrates another cross-sectional view of the display panel along the A-A direction in FIG. 2 consistent with various disclosed embodiments of the present disclosure.

FIG. 4 illustrates another cross-sectional view of the display panel along the A-A direction in FIG. 2; and FIG. 5 illustrates another cross-sectional view of the display panel along the A-A direction in FIG. 2. In one embodiment illustrated in FIG. 4 and FIG. 5, the display panel 100 may include a color film substrate 10, an array substrate 20 opposite to the color film substrate 10, and at least one light sensitive unit 30 on a side of the array substrate 20 adjacent to the color film substrate 10. As illustrated in FIG. 2, the display panel 100 may further include collimating apertures 50, and the collimating apertures 50 may penetrate through a portion of film layers of the color film substrate 10 and the array substrate 20 along a first direction X. The collimating apertures 50 and the at least one light sensitive unit 30 may be disposed in a one-to-one correspondence. The first direction X may be perpendicular to the display panel. The color film substrate 10 may include a first substrate 11, a first light-blocking layer 12, and at least one second light-blocking layer 13. The first light-blocking layer 12 may be disposed at a side of the first substrate 11 adjacent to the array substrate 20 and may include a plurality of first openings 121. The at least one second light-blocking layer 13 may be disposed at a side of the first light-blocking layer 12 adjacent to the array substrate 20 and may include a plurality of second openings 131. The array substrate 20 may include a third light-blocking layer 21 at a side of the array substrate 20 adjacent to the color film substrate 10. The third light-blocking layer 21 may include a plurality of third openings 211. An orthographic projection of each of the plurality of first openings 121, an orthographic projection of a corresponding second opening 131 of the plurality of second openings 131, and an orthographic projection of a corresponding third opening 211 of the plurality of third openings 211, on the first substrate 11 may at least partially overlap an orthographic projection of a corresponding collimating aperture 50 of the plurality of collimating apertures 50 on the first substrate 11. For description purposes only, the embodiment in FIG. 3 where the orthographic projection of each of the plurality of first openings 121, the orthographic projection of the corresponding second opening 131, and the orthographic projection of the corresponding third opening 211, on the first substrate 11 completely overlap the orthographic projection of the corresponding collimating aperture 50 on the first substrate 11, is used as an example to illustrate the present disclosure and should not limit scopes of the present disclosure. In some other embodiments, the orthographic projection of each of the plurality of first openings 121, the orthographic projection of the corresponding second opening 131, and the orthographic projection of the corresponding third opening 211, on the first substrate 11 may only partially overlap the orthographic projection of the corresponding collimating aperture 50 on the first substrate 11. The orthographic projection of each of the plurality of first openings, the orthographic projection of the corresponding second opening, and the orthographic projection of the corresponding third opening, on the first substrate may at least partially overlap the orthographic projection of the corresponding collimating aperture on the first substrate, along the first direction, to provide a channel to the fingerprint information received by the at least one light sensitive unit. The light entering the collimating apertures may be also constrained. An influence of the light noise on the fingerprint information may be avoided, and the accuracy of the fingerprint identification may be improved.

In one embodiment illustrated in FIG. 4, the array substrate 20 of the display panel 100 may include a second substrate 22, a buffer layer 23, the at least one light sensitive unit 30, a common electrode layer 24, a first insulating layer 25, and a pixel electrode layer 26. The buffer layer 23, the at least one light sensitive unit 30, the common electrode layer 24, the first insulating layer 25, and the pixel electrode layer 26 may be stacked on the second substrate 22 sequentially. The pixel electrode layer 26 may include at least one fourth openings 261. An orthographic projection of each of the at least one fourth opening 261 on the first substrate 11 may at least partially overlap an orthographic projection of a corresponding light sensitive unit 30 of the at least one light sensitive unit 30 on the first substrate 11. The at least one light sensitive unit 30 may be formed from poly-Si or a-Si on an interlayer insulating layer between the common electrode layer 24 and the buffer layer 23. The buffer layer 23 may be disposed on a side of the second substrate 22 adjacent to the color film substrate 10, and the at least one light sensitive unit 30 may be disposed at a side of the buffer layer 23 adjacent to the color film substrate 10. The common electrode layer 24 may be disposed at a side of the at least one light sensitive unit 30 adjacent to the color film substrate 10, and the first insulating layer 25 may be disposed at a side of the common electrode layer 24 adjacent to the color film substrate 10. The pixel electrode layer 26 may be disposed at a side of the first insulating layer 25 adjacent to the color film substrate 10. The pixel electrode layer 26 may include the at least one fourth openings 261. The orthographic projection of each of the at least one fourth opening 261 on the first substrate 11 may at least partially overlap the orthographic projection of the corresponding light sensitive unit 30. This means the at least one fourth opening 261 may be formed by hollowing out portions of the pixel electrode layer 26 corresponding to the at least one light sensitive unit 30. Since the pixel electrode layer 26 may be formed by a material with a refractive index of about 1.9, a portion of the light entering the pixel electrode layer 26 may change the propagation direction by refraction and may not penetrate through the pixel electrode layer 26 to arrive at the at least one light sensitive unit 30. The at least one fourth opening 261 disposed in the pixel electrode layer 26 above the at least one light sensitive unit 30 may reduce a loss of the light in the pixel electrode layer 26 significantly. Correspondingly, the light arriving at the at least one light sensitive unit 30 may increase and the at least one light sensitive unit 30 may form a clearer image, to improve the accuracy of the fingerprint identification.

In an embodiment illustrated in FIG. 5, the array substrate 20 of the display panel 100 may include a second substrate 22, a buffer layer 23, the at least one light sensitive unit 30, a common electrode layer 24, a first insulating layer 25, and a pixel electrode layer 26. The buffer layer 23, the at least one light sensitive unit 30, the common electrode layer 24, the first insulating layer 25, and the pixel electrode layer 26 may be stacked on the second substrate 22 sequentially. The first insulating layer 25 may include at least one fifth opening 251. An orthographic projection of each of the at least one fifth opening 251 on the first substrate 11 may at least partially overlap an orthographic projection of a corresponding light sensitive unit of the at least one light sensitive unit 30 on the first substrate 11. In FIG. 5, the buffer layer 23 may be disposed on a side of the second substrate 22 adjacent to the color film substrate 10, and the at least one light sensitive unit 30 may be disposed at a side of the buffer layer 23 adjacent to the color film substrate 10. The common electrode layer 24 may be disposed at a side of the at least one light sensitive unit 30 adjacent to the color film substrate 10, and the first insulating layer 25 may be disposed at a side of the common electrode layer 24 adjacent to the color film substrate 10. The pixel electrode layer 26 may be disposed at a side of the first insulating layer 25 adjacent to the color film substrate 10. The first insulating layer 25 may include the at least one fifth opening 251. The orthographic projection of each of the at least one fifth opening 251 on the first substrate 11 may at least partially overlap the orthographic projection of the corresponding light sensitive unit 30 on the first substrate 11. This means portions of the first insulating layer 25 corresponding to the at least one light sensitive unit 30 may be hollowed out. Since the first insulating layer 25 may be made of a material with a refraction index of about 1.91, a portion of the light entering the first insulating layer 25 may change the propagation direction by refraction and may not arrive at the at least one light sensitive unit 30 by passing through the first insulating layer 25. By disposing the at least one fifth opening 251 in the first insulating layer 25 above the at least one light sensitive unit 30, a loss of the light in the first insulating layer 25 may be reduced significantly and the light arriving at the at least one light sensitive unit 30 may increase. Correspondingly, the at least one light sensitive unit 30 may form a clearer image, to improve the accuracy of the fingerprint identification.

Figure 6:
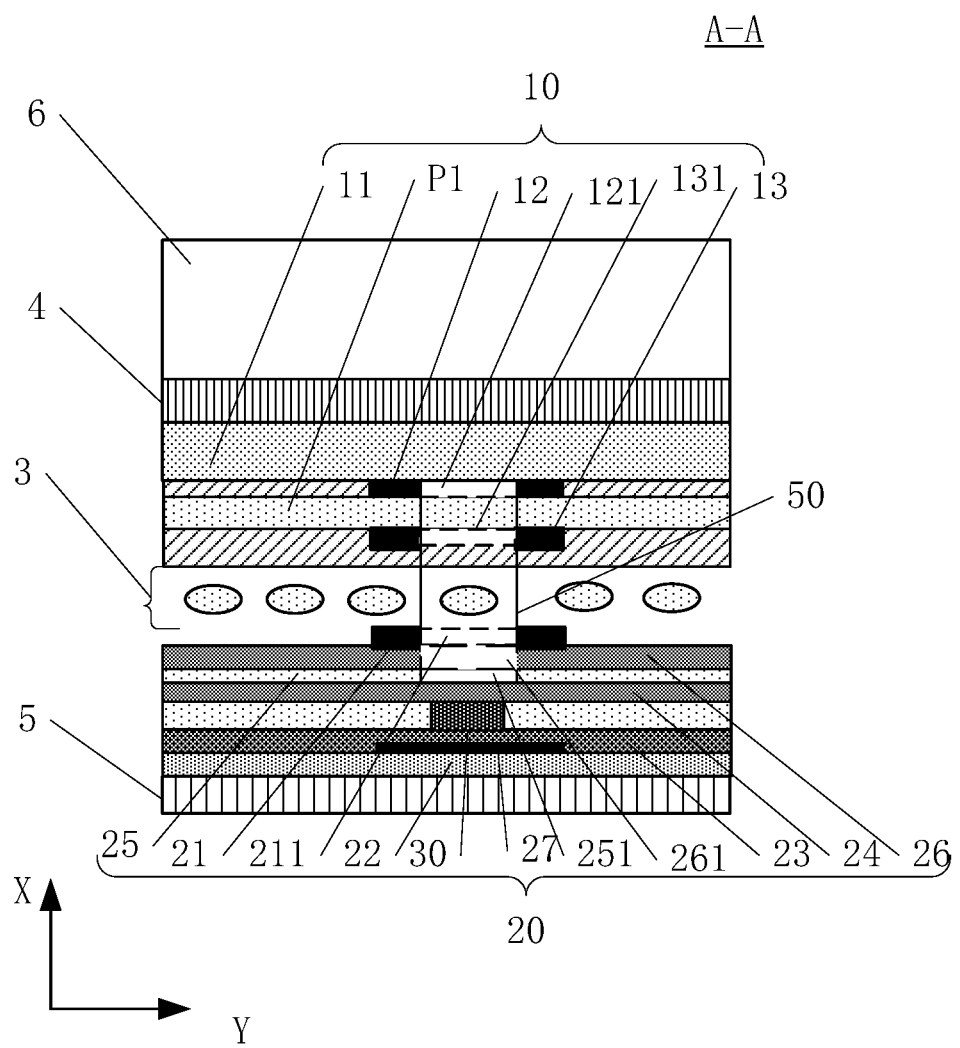
FIG. 6 illustrates another cross-sectional view of the display panel along the A-A direction in FIG. 2 consistent with various disclosed embodiments of the present disclosure.

FIG. 6 illustrates another cross-sectional view of the display panel along the A-A direction in FIG. 2. In one embodiment illustrated in FIG. 6, the display panel 100 may include a color film substrate 10, an array substrate 20 opposite to the color film substrate 10, and at least one light sensitive unit 30 on a side of the array substrate 20 adjacent to the color film substrate 10. As illustrated in FIG. 2, the display panel 100 may further include collimating apertures 50, and the collimating apertures 50 may penetrate through a portion of film layers of the color film substrate 10 and the array substrate 20 along a first direction X. The collimating apertures 50 and the at least one light sensitive unit 30 may be disposed in a one-to-one correspondence. The first direction X may be perpendicular to the display panel. The color film substrate 10 may include a first substrate 11, a first light-blocking layer 12, and at least one second light-blocking layer 13. The first light-blocking layer 12 may be disposed at a side of the first substrate 11 adjacent to the array substrate 20 and may include a plurality of first openings 121. The at least one second light-blocking layer 13 may be disposed at a side of the first light-blocking layer 12 adjacent to the array substrate 20 and may include a plurality of second openings 131. The array substrate 20 may include a third light-blocking layer 21 at a side of the array substrate 20 adjacent to the color film substrate 10. The third light-blocking layer 21 may include a plurality of third openings 211. An orthographic projection of each of the plurality of first openings 121, an orthographic projection of a corresponding second opening 131 of the plurality of second openings 131, and an orthographic projection of a corresponding third opening 211 of the plurality of third openings 211, on the first substrate 11 may at least partially overlap an orthographic projection of a corresponding collimating aperture 50 of the plurality of collimating apertures 50 on the first substrate 11. For description purposes only, the embodiment in FIG. 3 where the orthographic projection of each of the plurality of first openings 121, the orthographic projection of the corresponding second opening 131, and the orthographic projection of the corresponding third opening 211, on the first substrate 11 completely overlap the orthographic projection of the corresponding collimating aperture 50 on the first substrate 11, is used as an example to illustrate the present disclosure and should not limit scopes of the present disclosure. In some other embodiments, the orthographic projection of each of the plurality of first openings 121, the orthographic projection of the corresponding second opening 131, and the orthographic projection of the corresponding third opening 211, on the first substrate 11 may only partially overlap the orthographic projection of the corresponding collimating aperture 50 on the first substrate 11. The orthographic projection of each of the plurality of first openings, the orthographic projection of the corresponding second opening, and the orthographic projection of the corresponding third opening, on the first substrate may at least partially overlap the orthographic projection of the corresponding collimating aperture on the first substrate, along the first direction, to provide a channel to the fingerprint information received by the at least one light sensitive unit. The light entering the collimating apertures may be also constrained. An influence of the light noise on the fingerprint information may be avoided, and the accuracy of the fingerprint identification may be improved.

As illustrated in FIG. 6, the array substrate 20 of the display panel 100 may include a second substrate 22, a buffer layer 23, the at least one light sensitive unit 30, a common electrode layer 24, a first insulating layer 25, and a pixel electrode layer 26. The buffer layer 23, the at least one light sensitive unit 30, the common electrode layer 24, the first insulating layer 25, and the pixel electrode layer 26 may be stacked on the second substrate 22 sequentially. The first insulating layer 25 may include at least one fifth opening 251, and the pixel electrode layer 26 may include at least one fourth openings 261. An orthographic projection of each of the at least one fourth opening 261 on the first substrate 11 and an orthographic projection of a corresponding fifth opening 251 of the at least one fifth opening 251, may at least partially overlap an orthographic projection of a corresponding light sensitive unit 30 of the at least one light sensitive unit 30 on the first substrate 11.

In FIG. 6, the buffer layer 23 may be disposed on a side of the second substrate 22 adjacent to the color film substrate 10, and the at least one light sensitive unit 30 may be disposed at a side of the buffer layer 23 adjacent to the color film substrate 10. The common electrode layer 24 may be disposed at a side of the at least one light sensitive unit 30 adjacent to the color film substrate 10, and the first insulating layer 25 may be disposed at a side of the common electrode layer 24 adjacent to the color film substrate 10. The pixel electrode layer 26 may be disposed at a side of the first insulating layer 25 adjacent to the color film substrate 10. The first insulating layer 25 may include the at least one fifth opening 251, and the pixel electrode layer 26 may include the at least one fourth openings 261. The orthographic projection of each of the at least one fourth opening 261 on the first substrate 11 and an orthographic projection of the corresponding fifth opening 251 on the first substrate 11, may at least partially overlap the orthographic projection of the corresponding light sensitive unit 30 on the first substrate 11. Since the first insulating layer 25 may be made of a material with a refraction index of about 1.91 and the pixel electrode layer 26 may be formed by a material with a refractive index of about 1.9, a portion of the light entering the first insulating layer 25 and the pixel electrode layer 26 may change the propagation direction by refraction and may not arrive at the at least one light sensitive unit 30 by passing through the first insulating layer 25 and the pixel electrode layer 26. By disposing the at least one fifth opening 251 in the first insulating layer 25 and the at least one fourth opening 261 in the pixel electrode layer 26 above the at least one light sensitive unit 30, a loss of the light in the first insulating layer 25 and the pixel electrode layer 26 may be reduced significantly and the light arriving at the at least one light sensitive unit 30 may increase. Correspondingly, the at least one light sensitive unit 30 may form a clearer image, to improve the accuracy of the fingerprint identification.

As illustrated in FIG. 6, each of the plurality of collimating apertures 50 may include a plurality of film layers along the first direction X, and each of the plurality film layers may have a refraction index of about 1.3 to about 1.7. Film layers of the plurality of film layers corresponding to the plurality of collimating apertures 50 with a higher refraction index, including the pixel electrode layer 26 and the first insulating layer 25, may be hollowed out, and the remaining film layers of the plurality of film layers corresponding to the plurality of collimating apertures 50 may have a refraction index of about 1.3 to about 1.7. Since each of the plurality film layers of the plurality of collimating apertures 50 may have a refraction index of about 1.3 to about 1.7, the light reflected by the ridges and the valleys of the fingerprint may be refracted less when passing through the plurality of collimating apertures 50, and the light arriving at the at least one light sensitive unit 30 may be increased. Correspondingly, the accuracy of the fingerprint identification may be improved.

As illustrated in FIGS. 4-6, the array substrate 20 may further include a fourth light-blocking layer 27 on a side of the buffer layer 23 away from the at least one light sensitive unit 30. An orthographic projection of each of the at least one light sensitive unit 30 on the second substrate 22 may be in an orthographic projection of the fourth light-blocking layer 27 on the second substrate 22. The liquid crystal display panel may not emit lights by itself and a light source of the liquid crystal display panel may be provided by a back-light source. The fourth light-blocking layer 27 may be disposed on the side of the buffer layer 23 away from the at least one light sensitive unit 30, to prevent an influence of light from the back-light source on the reflected light by the ridges or the valleys of the fingerprint. An influence of the light from the backlight source on the fingerprint identification may be avoided. If a size of the fourth light-blocking layer is larger, the light from the backlight source may be blocked better.

Figure 7:
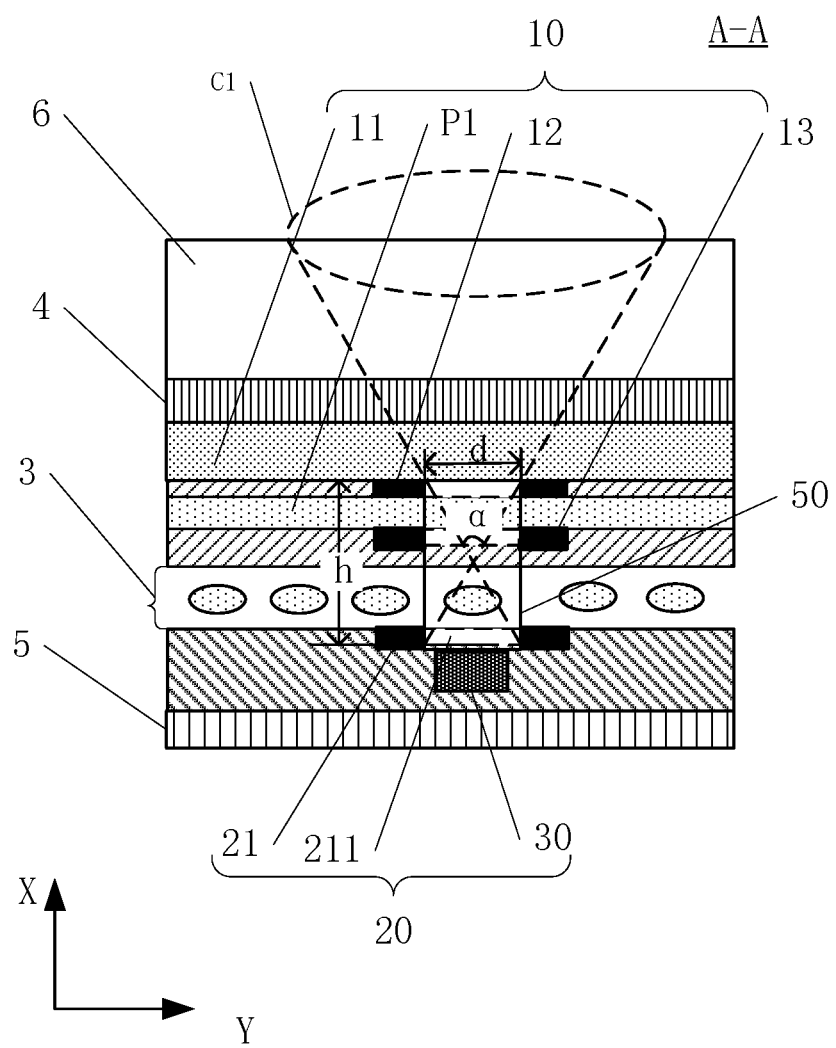
FIG. 7 illustrates another cross-sectional view of the display panel along the A-A direction in FIG. 2 consistent with various disclosed embodiments of the present disclosure.

As illustrated in FIG. 7, in some embodiments, the plurality of collimating apertures 50 may have a height h along the first direction X, and may have an aperture d. A ratio between h and d may be about 3:1 to about 10:1. The hole diameter d may be a radial width of the plurality of collimating apertures 50, i.e., a minimum distance along a second direction Y. If the plurality of collimating apertures 50 is circular, the aperture is a diameter. If the plurality of collimating apertures 50 is rectangles, the aperture is a minimum distance along a second direction Y. The second direction Y may be a direction crossing the first direction X.

The shape of the plurality of collimating apertures 50 may determine a shape of a light spot that can be identified by the at least one light sensitive unit 30. The plurality of collimating apertures 50 may be perpendicular to the at least one light sensitive unit 30. C1 in FIG. 7 may be an area of the light spot that can be identified by one of the at least one light sensitive unit 30. When the ratio between h and d may be about 3:1 to about 10:1, the area of the light spot that can be identified by one of the at least one light sensitive unit 30 may be guaranteed to be one ridge or one valley of the fingerprint. The accuracy of the fingerprint identification may be improved.

When the ratio between h and d (h:d) is smaller than 3:1, the area of the light spot that can be identified by one of the at least one light sensitive unit 30 may be larger, and may include information more than one ridge and valley of the fingerprint. Correspondingly, the light arriving at the one of the at least one light sensitive unit 30 may include the reflected light from the ridge and the valley of the fingerprint. The one of the at least one light sensitive unit 30 could not determine whether it is the ridge or the valley of the fingerprint accurately, and the accuracy of the fingerprint identification may be compromised. When the ratio between h and d (h:d) is larger than 10:1, the area of the light spot that can be identified by one of the at least one light sensitive unit 30 may be smaller, and may not include one ridge or one valley of the fingerprint completely. Correspondingly, the light arriving at the one of the at least one light sensitive unit 30 may not include the reflected light from the ridge or the valley of the fingerprint completely. The one of the at least one light sensitive unit 30 could not determine whether it is the ridge or the valley of the fingerprint accurately, and the accuracy of the fingerprint identification may be compromised.

As illustrated in FIG. 7, the aperture d of the plurality of collimating apertures 50 may be 3 μm<d<10 μm. The plurality of collimating apertures 50 may be disposed in non-opening regions to avoid an influence on the opening ratio of the display panel. When the height of the plurality of collimating apertures 50 is fixed, if the aperture d of the plurality of collimating apertures 50 may be 3 μm<d<10 μm, an influence on the opening ratio of the display panel may be avoided, and the area of the light spot that can be identified by one of the at least one light sensor may be guaranteed to include one ridge or one valley of the fingerprint completely. The accuracy of the fingerprint identification may be improved.

As illustrated in FIG. 7, the plurality of collimating apertures 50 may have a light-collecting angle α of about 12° to about 30°. The plurality of collimating apertures 50 with the light-collecting angle α of about 12° to about 30° may guarantee that the area of the light spot that can be identified by one of the at least one light sensor includes one ridge or one valley of the fingerprint completely. The accuracy of the fingerprint identification may be improved. If the light collecting angle α is larger than 30°, the area of the light spot that can be identified by one of the at least one light sensitive unit 30 may be larger, and may include information more than one ridge and valley of the fingerprint. Correspondingly, the light arriving at the one of the at least one light sensitive unit 30 may include the reflected light from the ridge and the valley of the fingerprint. The one of the at least one light sensitive unit 30 could not determine whether it is the ridge or the valley of the fingerprint accurately, and the accuracy of the fingerprint identification may be compromised. If the light collecting angle α is smaller than 12°, the area of the light spot that can be identified by one of the at least one light sensitive unit 30 may be smaller, and may not include one ridge or one valley of the fingerprint completely. Correspondingly, the light arriving at the one of the at least one light sensitive unit 30 may not include the reflected light from the ridge or the valley of the fingerprint completely. The one of the at least one light sensitive unit 30 could not determine whether it is the ridge or the valley of the fingerprint accurately, and the accuracy of the fingerprint identification may be compromised.

Figure 8:
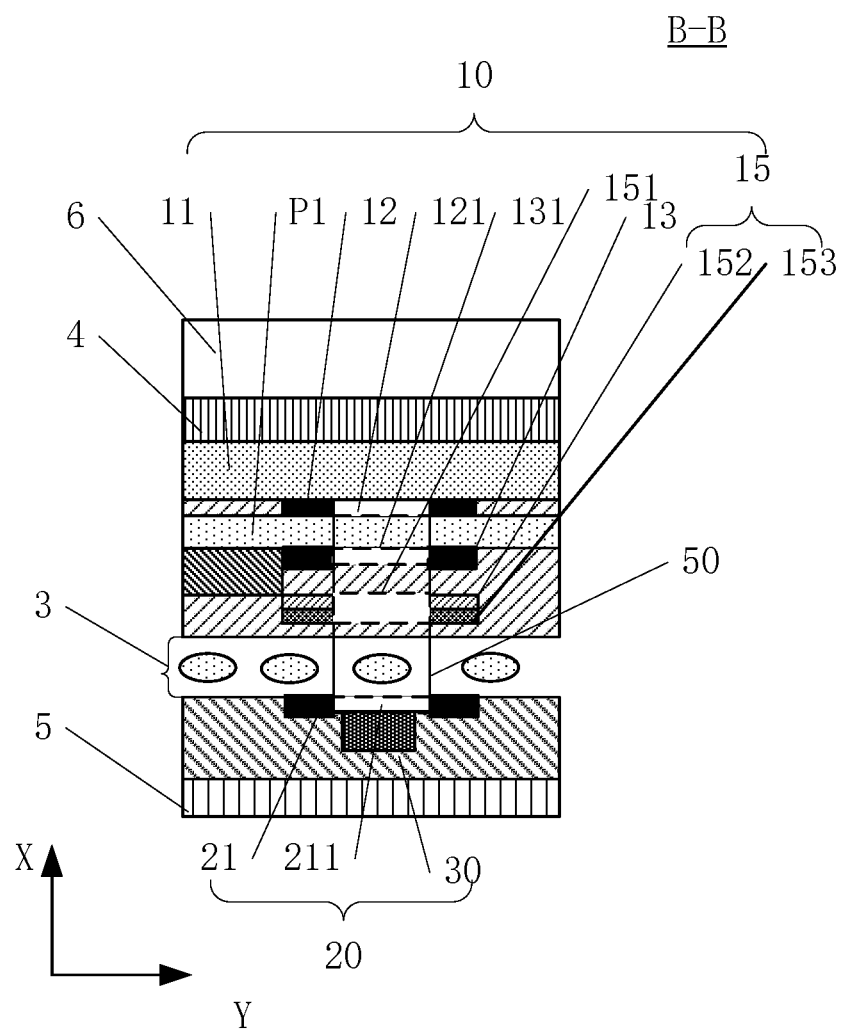
FIG. 8 illustrates a cross-sectional view of the display panel along a B-B direction in FIG. 2 consistent with various disclosed embodiments of the present disclosure.

As illustrated in FIG. 8 showing a cross-sectional view along a B-B direction of the display panel in FIG. 2, the color film substrate 10 may include a color film layer 14 and at least one fifth light-blocking layer 15. The at least one fifth light-blocking layer 15 and the color film layer 14 may be disposed in a same layer. Along the first direction X, the at least one fifth light-blocking layer 15 may be formed by stacking at least two of a red color blocker, a green color blocker, and a blue color blocker. By stacking at least two of a red color blocker, a green color blocker, and a blue color blocker, the at least one fifth light-blocking layer 15 may be formed to block the light and may be formed in a same process for forming the color film layer 14. A fabrication process may be simplified.

For description purposes only, the embodiment in FIG. 8 where the at least one fifth light-blocking layer 15 is formed by stacking the red color blocker 152 and the blue color blocker 153 is used as an example to illustrate the present disclosure, and should not limit the scope of the present disclosure. Since a transmission spectrum of the red color blocker 152 and a transmission spectrum of the blue color blocker 153 may not overlap, no light may transmit when the light passes through the at least one fifth light-blocking layer 15 formed by stacking the red color blocker 152 and the blue color blocker 153, and the light may be blocked. In some other embodiments, the at least one fifth light-blocking layer 15 may be formed by stacking a red color blocker and a green color blocker, or stacking a green color blocker and a blue color blocker, or stacking a red color blocker, a green color blocker, and a blue color blocker.

The at least one fifth light-blocking layer 15 may include a plurality of sixth openings 151. An orthographic projection of each of the plurality of sixth openings 151 on the first substrate 11 along the first direction X may at least partially overlap the orthographic projection of a corresponding light sensitive unit 30 of the at least one light sensitive unit 30 on the first substrate 11 along the first direction X, to form a channel for the reflected light by the ridges or the valleys of the fingerprint to pass through the one of the plurality of sixth openings 151 and to arrive at the one of the at least one light sensitive unit 30.

Figure 9:
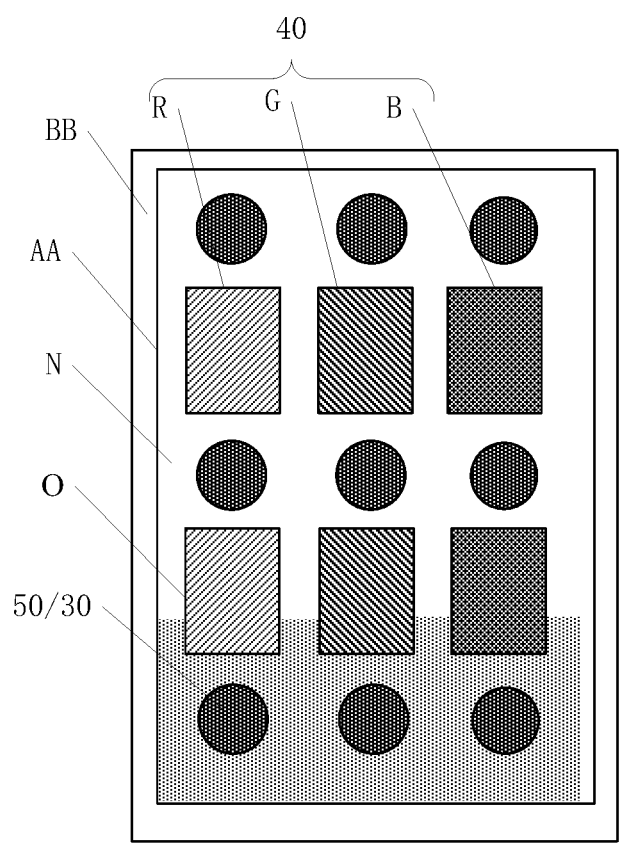
FIG. 9 illustrates another exemplary display panel consistent with various disclosed embodiments of the present disclosure.

FIG. 9 illustrates another exemplary display panel provided by another embodiment of the present disclosure. The display panel 100 may include a display region AA. The display region AA may include opening areas O arranged in an array, and a non-opening region N surrounding the opening areas O. The plurality of collimating apertures 50 and the at least one light sensitive unit 30 may be disposed in the non-opening region N.

Along the direction perpendicular to the display panel 100, the plurality of collimating apertures 50 and the at least one light sensitive unit 30 may be disposed in a one-to-one correspondence. The display panel 100 may further include a non-display region BB surrounding the display region AA. For description purposes only, the embodiment in FIG. 9 where the plurality of collimating apertures 50 is circular is used as an example to illustrate the present disclosure and should not limit the scopes of the present disclosure. In various embodiments, a shape of the plurality of collimating apertures 50 may be any suitable shape, as long as the plurality of collimating apertures 50 and the at least one light sensitive unit 30 are disposed in the non-opening region N. The opening areas O may be areas that the light can transmit. For description purposes only, the embodiment in FIG. 9 with a certain quantity of the plurality of collimating apertures 50 and a certain quantity of pixels 40 is used as an example to illustrate the present disclosure and should not limit the scopes of the present disclosure. In various embodiments, the display panel may include any suitable number of the plurality of collimating apertures 50 and the pixels 40. The present disclosure has no limit on this.

The plurality of collimating apertures 50 may be areas that light can transmit, and areas around the plurality of collimating apertures 50 may be opaque areas. The plurality of collimating apertures 50 and the at least one light sensitive unit 30 may occupy a certain space. By disposing the plurality of collimating apertures 50 and the at least one light sensitive unit 30 in the non-opening region N, an influence on a display performance in the opening areas O.

Figure 10:
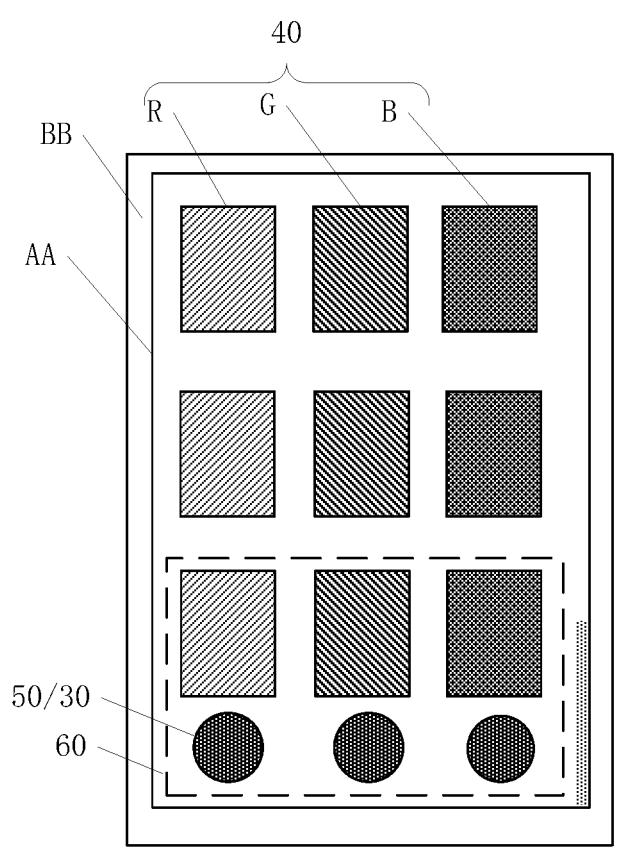
FIG. 10 illustrates another exemplary display panel consistent with various disclosed embodiments of the present disclosure.

FIG. 10 illustrates another exemplary display panel provided by another embodiment of the present disclosure. The display panel 100 may include a display region AA, a non-display region BB surrounding the display region AA, and a fingerprint identification area 60. The at least one light sensitive unit 30 may be disposed in the fingerprint identification area 60. An orthographic projection of the fingerprint identification area 60 on the color film substrate 10 may at least partially overlap an orthographic projection of the display region AA on the color film substrate 10. The plurality of collimating apertures 50 and the at least one light sensitive unit 30 may be disposed in the fingerprint identification area 60. For description purposes only, the embodiment in FIG. 10 is used as an example to illustrate the present disclosure and should not limit the scopes of the present disclosure. In various embodiments, the fingerprint identification area 60 may be a ¼ screen, a half screen, or a full screen. This means that the fingerprint identification area 60 may at least partially overlap the display region AA. When the fingerprint identification area 60 is a ¼ screen or a half screen, the fingerprint identification area 60 may partially overlap the display region AA, and the fingerprint identification may be achieved in a portion of the display screen 100 through the fingerprint identification area 60. Correspondingly, wires for the at least one light sensitive unit 30 may be reduced and a fabrication process may be simplified. When the fingerprint identification area 60 is a full screen, the fingerprint identification area 60 may completely overlap the display region AA. A finger may touch any position on the display screen to trigger the at least one light sensitive unit 30 to perform the fingerprint identification. A full-screen fingerprint identification may be achieved, and the fingerprint identification may be faster and more convenient.

The cross-sectional shape of the plurality of collimating apertures 50 may be one of a circle, an oval, and a rectangle. For description purposes only, the embodiment in FIG. 2 where the orthographic projection of each of the plurality of collimating apertures 50 is a circle is used as an example to illustrate the present disclosure and should not limit the scopes of the present disclosure. In other embodiments, the orthographic projection of each of the plurality of collimating apertures 50 may be another suitable shape including an oval and a rectangle. The shape of the plurality of collimating apertures 50 may determine a shape of the light spots. The present disclosure has no limit on the shape of the plurality of collimating apertures 50, as long as the light reflected by a same ridge or a same valley of the fingerprint can arrive at a corresponding light sensitive unit 30 through a corresponding collimating aperture 50 of the plurality of collimating apertures. The plurality of collimating apertures 50 may constrain the light entering the plurality of collimating apertures 50, and the accuracy of the fingerprint identification may be improved.

Figure 11:
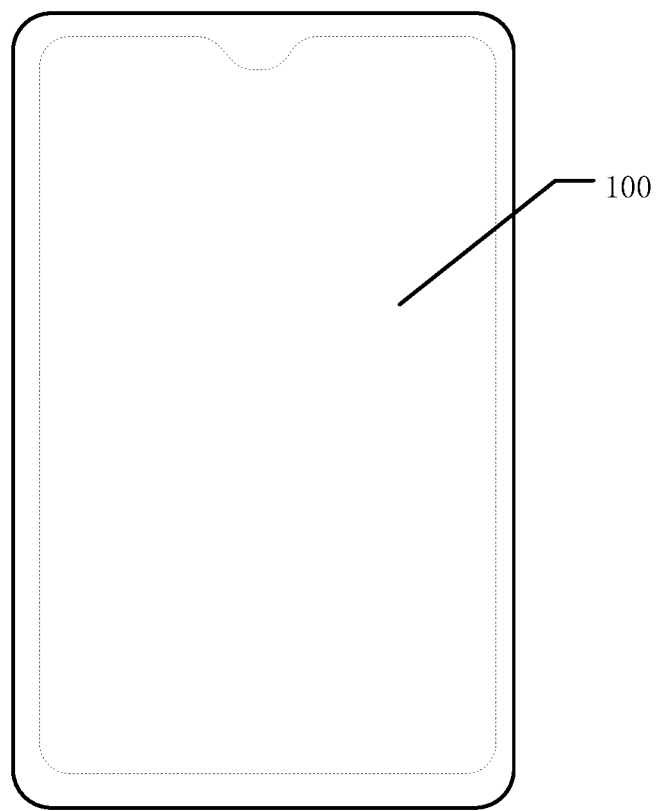
FIG. 11 illustrates an exemplary display device consistent with various disclosed embodiments of the present disclosure.

The present disclosure also provides a display device. As illustrated in FIG. 11, in one embodiment, the display device 200 may include a display panel 100 provided by any embodiments of the present disclosure. For description purposes only, the embodiment in FIG. 11 where the display device 200 is a cell phone is used as an example to illustrate the present disclosure, and should not limit the scopes of the present disclosure. In some other embodiments, the display device 200 may be a computer, a television, an electronic paper, a vehicle display device, or other display devices with a display function.

In the present disclosure, the display panel may include the color film substrate and the array substrate opposite to the color film substrate. The at least one light sensitive unit may be disposed at the side of the array substrate adjacent to the color film substrate. The display panel may further include the plurality of collimating apertures penetrating through the portion of the film layers of the color film substrate and the array substrate along the first direction. The plurality of collimating apertures and the at least one light sensitive unit may be disposed in a one-to-one correspondence. The first direction may be perpendicular to the display panel. The color film substrate may include the first substrate, the first light-blocking layer, and the at least one second light-blocking layer. The first light-blocking layer may be disposed at the side of the first substrate adjacent to the array substrate and may include the plurality of first openings. The at least one second light-blocking layer may be disposed at the side of the first light-blocking layer adjacent to the array substrate and may include the plurality of second openings. The array substrate may include the third light-blocking layer. The third light-blocking layer may be disposed at the side of the array substrate adjacent to the color film substrate and may include the plurality of third openings. The orthographic projection of each of the plurality of first openings, the orthographic projection of the corresponding second opening, and the orthographic projection of the corresponding third opening, on the first substrate may at least partially overlap the orthographic projection of the corresponding collimating aperture on the first substrate, along the first direction, to provide a channel to the fingerprint information received by the at least one light sensitive unit. The light entering the collimating apertures may be also constrained. An influence of the light noise on the fingerprint information may be avoided, and the accuracy of the fingerprint identification may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments but may be embodied in other equivalent forms without departing from the scope of the present disclosure, which is determined by the appended claims.

What is claimed is:

1. A display panel, comprising:
a color film substrate and an array substrate, that are oppositely configured;
a liquid crystal layer disposed between the color film substrate and the array substrate;
at least one light sensitive unit, configured at a side of the array substrate adjacent to the color film substrate;
collimating apertures, passing through a portion of film layers of the color film substrate and the array substrate along a first direction;

wherein:
the display panel includes a display region;
the display region includes opening areas arranged in an array and a non-opening area surrounding the opening areas;
the collimating apertures and the at least one light sensitive unit are disposed in the non-opening area;
the collimating apertures and the at least one light sensitive unit are disposed in a one-to-one correspondence;
the first direction is perpendicular to the display panel;
the color film substrate includes a first substrate, a first light-blocking layer, and at least one second light-blocking layer;
the first light-blocking layer is disposed at a side of the first substrate adjacent to the array substrate, and includes a plurality of first openings;
the at least one second light-blocking layer is disposed at a side of the first light-blocking layer adjacent to the array substrate, and includes a plurality of second openings;
the array substrate includes a third light-blocking layer;
the third light-blocking layer is disposed at the side of the array substrate adjacent to the color film substrate, and includes a plurality of third openings;
the first light-blocking layer and the second light-blocking layer are located on a side of the liquid crystal layer away from the array substrate, and the third light-blocking layer is located on a side of the liquid crystal layer close to the array substrate;
the collimating apertures pass sequentially through each first opening of the plurality of first openings in the first light-blocking layer, a corresponding second opening of the plurality of second openings in the second light-blocking layer, and a corresponding third opening of the plurality of third openings in the third light-blocking layer; and
an orthographic projection of each of the plurality of first openings on the first substrate, an orthographic projection of a corresponding second opening of the plurality of second openings on the first substrate, and an orthographic projection of a corresponding third opening of the plurality of third openings on the first substrate, at least partially overlap an orthographic projection of a corresponding collimating aperture of the collimating apertures on the first substrate.

2. The display panel according to claim 1, wherein:
the array substrate includes a second substrate, a buffer layer, the at least one light sensitive unit, a common electrode layer, a first insulating layer, and a pixel electrode layer;
the buffer layer, the at least one light sensitive unit, the common electrode layer, the first insulating layer, and the pixel electrode layer are stacked on the second substrate sequentially;
the pixel electrode layer includes at least one fourth opening, or the first insulating layer includes at least one fifth opening; and
an orthographic projection of each of the at least one fourth opening on the first substrate at least partially overlaps an orthographic projection of a corresponding light sensitive unit of the at least one light sensitive unit, or an orthographic projection of each of the at least one fifth opening on the first substrate at least partially overlaps an orthographic projection of a corresponding light sensitive unit of the at least one light sensitive unit.

3. The display panel according to claim 2, wherein:
the array substrate further includes a fourth light-blocking layer at a side of the buffer layer away from the at least one light sensitive unit; and
an orthographic projection of the at least one light sensitive unit on the second substrate is located within an orthographic projection of the fourth light-blocking layer on the second substrate.

4. The display panel according to claim 1, wherein:
a ratio between a height h of the collimating apertures along the first direction and an aperture d of the collimating apertures is about 3:1 to about 10:1.

5. The display panel according to claim 4, wherein:
the aperture d of the collimating apertures is larger than 3 μm and smaller than 10 μm.

6. The display panel according to claim 4, wherein:
the collimating apertures have a light-collecting angle of about 12° to about 30°.

7. The display panel according to claim 1, wherein:
the color film substrate includes a color film layer and at least one fifth light-blocking layer;
the color film layer and the at least one fifth light-blocking layer are disposed in a same single layer; and
the at least one fifth light-blocking layer is formed by stacking at least two of a red color blocker, a green color blocker, and a blue color blocker, along the first direction.

8. The display panel according to claim 1, wherein:
the display panel further includes a non-display region surrounding the display region, and a fingerprint identification region;
the at least one light sensitive unit is disposed in the fingerprint identification region; and
an orthographic projection of the fingerprint identification region on the color film substrate at least partially overlaps an orthographic projection of the display region on the color film substrate.

9. The display panel according to claim 1, wherein:
the collimating apertures have a cross-sectional shape including one of circle, oval, and rectangle.

10. A display panel, comprising:
a color film substrate and an array substrate, that are oppositely configured;
at least one light sensitive unit, configured at a side of the array substrate adjacent to the color film substrate;
collimating apertures, passing through a portion of film layers of the color film substrate and the array substrate along a first direction;
wherein:
  the collimating apertures and the at least one light sensitive unit are disposed in a one-to-one correspondence;
  the first direction is perpendicular to the display panel;
  the color film substrate includes a first substrate, a first light-blocking layer, and at least one second light-blocking layer;
  the first light-blocking layer is disposed at a side of the first substrate adjacent to the array substrate, and includes a plurality of first openings;
  the at least one second light-blocking layer is disposed at a side of the first light-blocking layer adjacent to the array substrate, and includes a plurality of second openings;
  the array substrate includes a third light-blocking layer;
  the third light-blocking layer is disposed at the side of the array substrate adjacent to the color film substrate, and includes a plurality of third openings;
  an orthographic projection of each of the plurality of first openings on the first substrate, an orthographic projection of a corresponding second opening of the plurality of second openings on the first substrate, and an orthographic projection of a corresponding third opening of the plurality of third openings on the first substrate, at least partially overlap an orthographic projection of a corresponding collimating aperture of the collimating apertures on the first substrate;
  the array substrate includes a second substrate, a buffer layer, the at least one light sensitive unit, a common electrode layer, a first insulating layer, and a pixel electrode layer;
  the buffer layer, the at least one light sensitive unit, the common electrode layer, the first insulating layer, and the pixel electrode layer are stacked on the second substrate sequentially;
  the pixel electrode layer includes at least one fourth opening;
  the first insulating layer includes at least one fifth opening; and
  an orthographic projection of each of the at least one fourth opening on the first substrate and an orthographic projection of a corresponding fifth opening of the at least one fifth opening on the first substrate at least partially overlap an orthographic projection of a corresponding light sensitive unit of the at least one light sensitive unit.

11. The display panel according to claim 10, wherein:
each of the collimating apertures includes a plurality of film layers along the first direction; and
the plurality of film layers has a refraction index of about 1.3 to about 1.7.

12. The display panel according to claim 10, wherein:
the array substrate further includes a fourth light-blocking layer at a side of the buffer layer away from the at least one light sensitive unit; and
an orthographic projection of the at least one light sensitive unit on the second substrate is located within an orthographic projection of the fourth light-blocking layer on the second substrate.

13. A display device, comprising a display panel, wherein:
the display panel includes: a color film substrate and an array substrate configured opposite to each other; a liquid crystal layer disposed between the color film substrate and the array substrate; at least one light sensitive unit disposed at a side of the array substrate adjacent to the color film substrate; and collimating apertures penetrating a portion of film layers of the color film substrate and the array substrate along a first direction;
wherein:
the display panel includes a display region;
the display region includes opening areas arranged in an array and a non-opening area surrounding the opening areas;
the collimating apertures and the at least one light sensitive unit are disposed in the non-opening area;
the collimating apertures and the at least one light sensitive unit are disposed in a one-to-one correspondence;
the first direction is perpendicular to the display panel;
the color film substrate includes a first substrate, a first light-blocking layer, and at least one second light-blocking layer;

the first light-blocking layer is disposed at a side of the first substrate adjacent to the array substrate, and includes a plurality of first openings;

the at least one second light-blocking layer is disposed at a side of the first light-blocking layer adjacent to the array substrate, and includes a plurality of second openings;

the array substrate includes a third light-blocking layer;

the third light-blocking layer is disposed at the side of the array substrate adjacent to the color film substrate, and includes a plurality of third openings;

the first light-blocking layer and the second light-blocking layer are located on a side of the liquid crystal layer away from the array substrate, and the third light-blocking layer is located on a side of the liquid crystal layer close to the array substrate;

the collimating apertures pass sequentially through each first opening of the plurality of first openings in the first light-blocking layer, a corresponding second opening of the plurality of second openings in the second light-blocking layer, and a corresponding third opening of the plurality of third openings in the third light-blocking layer; and an orthographic projection of each of the plurality of first openings on the first substrate, an orthographic projection of a corresponding second opening of the plurality of second openings on the first substrate, and an orthographic projection of a corresponding third opening of the plurality of third openings on the first substrate, at least partially overlap an orthographic projection of a corresponding collimating aperture of the collimating apertures on the first substrate.

14. The display device according to claim 13, wherein:

the array substrate includes a second substrate, a buffer layer, the at least one light sensitive unit, a common electrode layer, a first insulating layer, and a pixel electrode layer;

the buffer layer, the at least one light sensitive unit, the common electrode layer, the first insulating layer, and the pixel electrode layer are stacked on the second substrate sequentially;

the pixel electrode layer includes at least one fourth opening, or the first insulating layer includes at least one fifth opening; and an orthographic projection of each of the at least one fourth opening on the first substrate at least partially overlaps an orthographic projection of a corresponding light sensitive unit of the at least one light sensitive unit, or an orthographic projection of each of the at least one fifth opening on the first substrate at least partially overlaps an orthographic projection of a corresponding light sensitive unit of the at least one light sensitive unit.

15. The display device according to claim 14, wherein:

the array substrate further includes a fourth light-blocking layer at a side of the buffer layer away from the at least one light sensitive unit; and an orthographic projection of the at least one light sensitive unit on the second substrate is located within an orthographic projection of the fourth light-blocking layer on the second substrate.

16. The display device according to claim 13, wherein:

the array substrate includes a second substrate, a buffer layer, the at least one light sensitive unit, a common electrode layer, a first insulating layer, and a pixel electrode layer;

the buffer layer, the at least one light sensitive unit, the common electrode layer, the first insulating layer, and the pixel electrode layer are stacked on the second substrate sequentially;

the pixel electrode layer includes at least one fourth opening;

the first insulating layer includes at least one fifth opening; and an orthographic projection of each of the at least one fourth opening on the first substrate and an orthographic projection of a corresponding fifth opening of the at least one fifth opening on the first substrate at least partially overlap an orthographic projection of a corresponding light sensitive unit of the at least one light sensitive unit.

17. The display device according to claim 16, wherein:

each of the collimating apertures includes a plurality of film layers along the first direction; and the plurality of film layers has a refraction index of about 1.3 to about 1.7.

18. The display device according to claim 16, wherein:

the array substrate further includes a fourth light-blocking layer at a side of the buffer layer away from the at least one light sensitive unit; and an orthographic projection of the at least one light sensitive unit on the second substrate is located within an orthographic projection of the fourth light-blocking layer on the second substrate.

19. The display device according to claim 13, wherein:

a ratio between a height h of the collimating apertures along the first direction and an aperture d of the collimating apertures is about 3:1 to about 10:1.

* * * * *